United States Patent
Zitlaw

(10) Patent No.: US 7,035,965 B2
(45) Date of Patent: *Apr. 25, 2006

(54) FLASH MEMORY WITH DATA DECOMPRESSION

(75) Inventor: Cliff Zitlaw, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 564 days.

This patent is subject to a terminal disclaimer.

(21) Appl. No.: 09/943,475

(22) Filed: Aug. 30, 2001

(65) Prior Publication Data

US 2003/0046485 A1 Mar. 6, 2003

(51) Int. Cl.
*G06F 12/00* (2006.01)

(52) U.S. Cl. ....................................... 711/103
(58) Field of Classification Search ................ 711/103
See application file for complete search history.

(56) References Cited

U.S. PATENT DOCUMENTS

| | | | |
|---|---|---|---|
| 5,557,777 A * | 9/1996 | Culbert | ............................ 713/2 |
| 5,926,422 A | 7/1999 | Haukness | |
| 6,058,056 A | 5/2000 | Beffa et al. | |
| 6,058,474 A * | 5/2000 | Baltz et al. | ..................... 713/1 |
| 6,125,392 A | 9/2000 | Labatte et al. | |
| 6,145,069 A * | 11/2000 | Dye | ........................... 711/170 |
| 6,173,381 B1 | 1/2001 | Dye | |
| 6,266,724 B1 * | 7/2001 | Harari et al. | ............... 710/301 |
| 6,295,618 B1 | 9/2001 | Keeth | |
| 6,307,790 B1 | 10/2001 | Roohparvar et al. | |
| 6,332,172 B1 * | 12/2001 | Iverson | ........................ 710/68 |
| 6,546,489 B1 * | 4/2003 | Frank et al. | ................ 713/187 |
| 6,735,669 B1 * | 5/2004 | Shin | ............................ 711/106 |
| 2002/0069354 A1 * | 6/2002 | Fallon et al. | .................. 713/2 |

* cited by examiner

*Primary Examiner*—B. James Peikari
*Assistant Examiner*—Woo H. Choi
(74) *Attorney, Agent, or Firm*—Leffert Jay & Polglaze, P.A.

(57) ABSTRACT

A processing system allows data downloads from a non-volatile memory to volatile memory. The non-volatile memory device includes a decompression engine to decompress the data prior to storing in the volatile memory. This built-in decompression circuit allows an increased amount of data to be stored in the flash. The compression operation is performed prior to initial storage in the flash memory.

15 Claims, 2 Drawing Sheets

FLASH MEMORY WITH DATA DECOMPRESSION

FIELD OF THE INVENTION

The present invention relates generally to data processing systems and in particular the present invention relates to initiation of data processing systems.

BACKGROUND OF THE INVENTION

Processing systems, or computers, typically include a processor and a memory device as internal storage areas for the computer. The term memory identifies data storage that comes in the form of integrated circuit chips. While there are several different types of memory, DRAM (dynamic random-access memory) is traditionally used as the main memory in a computer environment. With the development of different RAM's, a high-speed synchronous-type DRAM is often used with the processor. The dynamic memory, however, cannot retain data in the absence of power. As such, computer system contains some non-volatile storage device. For example, a magnetic storage device or non-volatile memory can be used to store data and software.

During operation, the processor copies data from the non-volatile storage to the dynamic memory. That is, the data from the non-volatile storage is routed via the processor to the dynamic memory. This process consumes power, is time consuming, and consumes processor bandwidth. In addition, the storage capacity of the non-volatile memory can limit the data available for transfer.

For the reasons stated above, and for other reasons stated below which will become apparent to those skilled in the art upon reading and understanding the present specification, there is a need in the art for a system and method which improves data transfer from a non-volatile storage device to a volatile storage device.

SUMMARY OF THE INVENTION

The above-mentioned problems with processing systems and other problems are addressed by the present invention and will be understood by reading and studying the following specification.

In one embodiment, a processing system comprises a processor, a volatile storage device coupled to communicate with the processor, and a non-volatile memory device coupled to communicate with the processor and the volatile storage device. The non-volatile memory device transfers data to the volatile storage device and includes a decompression circuit to decompress the data while transferring to the volatile storage device.

In another embodiment, a processing system comprises a processor, a synchronous memory device coupled to communicate with the processor via a synchronous bus, and a flash memory device coupled to communicate with the processor via a serial bus and communicate with the synchronous memory device via a direct bus. The flash memory device transfers data to the synchronous memory device, and includes a decompression circuit to decompress the data while transferring to the synchronous memory device.

A processor system power-up method comprises detecting a power-up condition and providing a reset signal to a volatile memory, initiating a direct data transfer from a non-volatile memory to the volatile memory in response to the reset signal, decompressing data stored in the non-volatile memory while transferring the data to the synchronous memory, and providing a system reset signal from the volatile memory to a processor.

Another processor system power-up method comprises detecting a power-up condition with a reset controller and providing a reset signal to a synchronous memory, using the synchronous memory, initiating a direct data transfer from a flash memory to the synchronous memory in response to the reset signal, decompressing data stored in the non-volatile memory while transferring the data to the synchronous memory, and providing a system reset signal from the synchronous memory to a processor after the data has been transferred.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
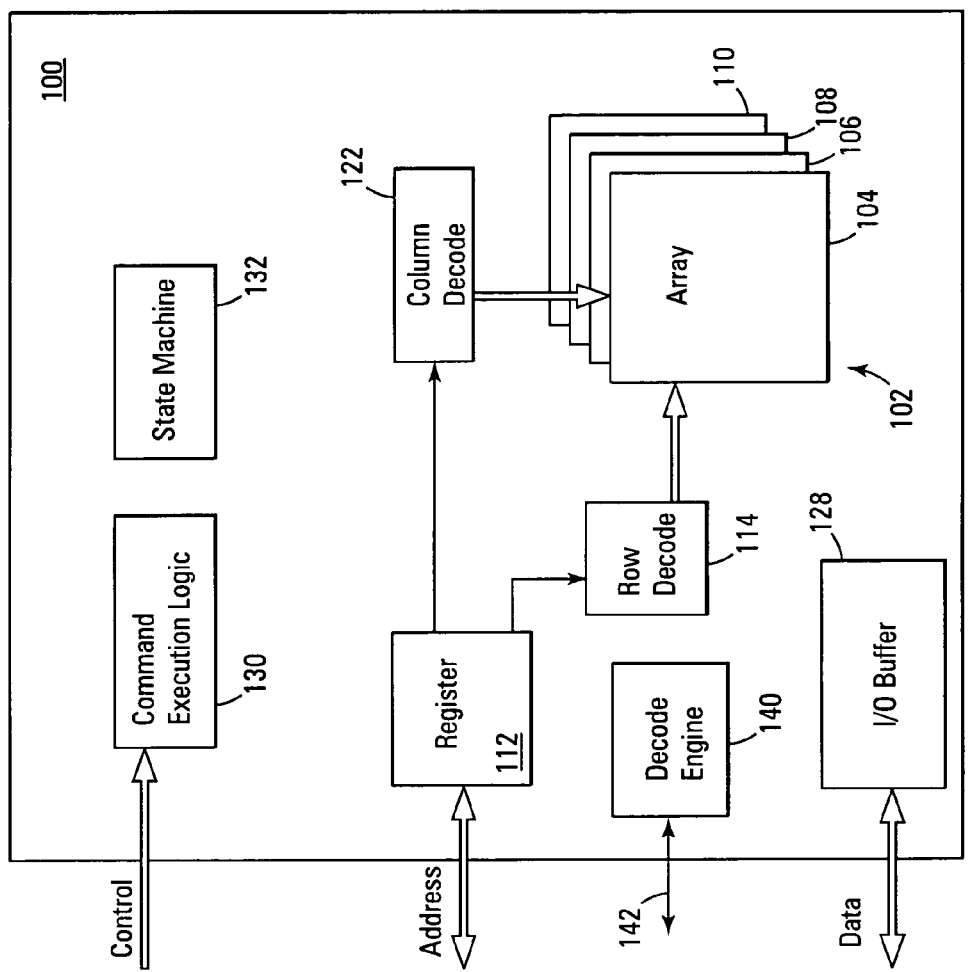
FIG. 1 illustrates a block diagram of a flash memory device of an embodiment of the present invention.

FIG. 1 illustrates a block diagram of a flash memory device of an embodiment of the present invention. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided addresses received by address register 112. The addresses are decoded using row address decoder circuitry 114. To access an appropriate column of the memory, the received addresses are coupled to column decode circuitry 122. Data is input and output I/O buffer 128. Command execution logic 130 is provided to control the basic operations of the memory device. A state machine 132 is also provided to control specific operations performed on the memory arrays and cells. A decompression engine 140 is provided in the memory, as explained below. A serial port 142 can be provided to communicate with an external storage device, as explained below.

Figure 2:
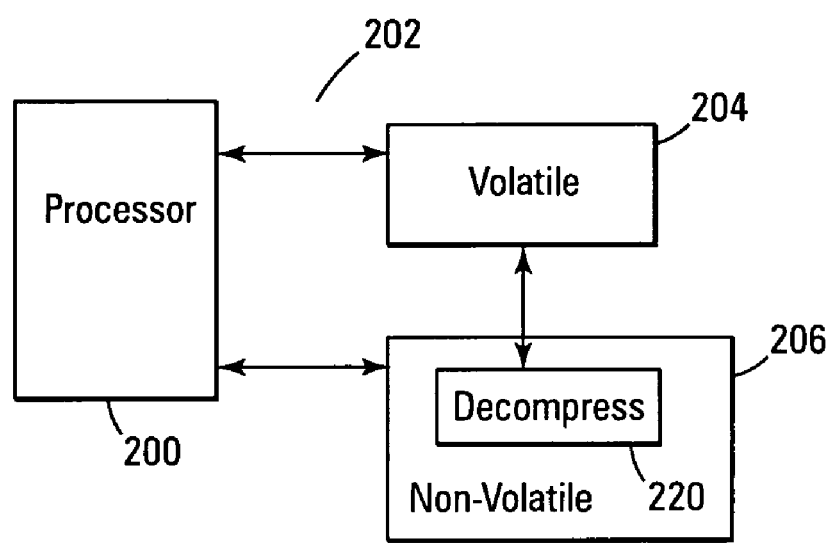
FIG. 2 is a block diagram of a system of the present invention.

Referring to FIG. 2, an embodiment of a processing system of the present invention is described. The system includes a central processing unit (CPU) 200, or processor, that is coupled to a synchronous memory bus 202 and corresponding synchronous DRAM memory(ies) 204. The processor is also coupled to a synchronous flash memory 206. The synchronous DRAM (SDRAM) is coupled to the flash memory for copying data from the flash to the SDRAM during a power-up operation, as explained below. The synchronous memory, in another embodiment, is a Rambus® DRAM (RDRAM). The present invention is not limited to a DRAM based volatile memory. That is, the present invention can be implemented to transfer data from a nonvolatile device, such as but not limited to a flash memory, EEPROM, or magnetic storage device, to any type of volatile storage device.

As further illustrated in FIG. 2, the present invention includes a decompression engine 220. The decompression engine allows data transferred from the flash memory to the synchronous memory to be decompressed. The decompression hardware, in one embodiment, can decompress data having a compression ratio of 2:1. It will be appreciated by those skilled in the art with the benefit of the present description that additional compression ratios can be implemented. The data stored in the memory is compressed prior to writing the memory. That is, the memory contains decompression but not compression circuitry. The decompression circuitry can incorporate any type of decompression algorithm, including but not limited to a Lempel-Ziv compression algorithm, see for example U.S. Pat. No. 4,558,302.

The present invention allows the non-volatile memory contents to be decompressed and loaded into the SDRAM. The processor can be used to load and update the data in the flash memory. The flash memory of one embodiment can include features of a synchronous flash device, as described in U.S. patent application Ser. No. 09/627,682 filed Jul. 28, 2000, and incorporated herein by reference. The present decompression circuit increases efficiency while loading the volatile memory.

CONCLUSION

A processing system has been described that allows data downloads from a non-volatile memory to volatile memory. The non-volatile memory device includes a decompression engine to decompress the data prior to storing in the volatile memory. This built-in decompression circuit allows an increased amount of data to be stored in the flash. The compression operation is performed prior to initial storage in the flash memory.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A processing system comprising:
   a processor that is adapted to write compressed data;
   a volatile memory device coupled to communicate with the processor over a first bus;
   a non-volatile memory device, external from the volatile memory device, coupled to receive the compressed data from the processor over a second bus separate from the first bus, the non-volatile memory device further connected to transfer data to the volatile memory device over a dedicated third bus without intervention by another device; and
   a decompression circuit provided in the non-volatile memory device to decompress the data being transferred to the volatile memory device.

2. The processing system of claim 1 wherein the volatile memory device initiates the data transfer.

3. The processing system of claim 1 wherein the non-volatile memory device is a flash memory device.

4. The processing system of claim 1 wherein the processor is coupled to store compressed data in the volatile memory device.

5. The processing system of claim 1 wherein volatile memory device is a dynamic random access memory.

6. A processing system comprising:
   a processor that is adapted to write compressed data;
   a synchronous memory device coupled to communicate with the processor via a synchronous first bus;
   a flash memory device coupled to receive the compressed data from the processor via a serial second bus and communicate with the synchronous memory device, wherein the flash memory device is separate from the synchronous memory device and transfers data to the synchronous memory device over a dedicated third bus without intervention by another device; and
   a decompression circuit provided in the flash memory device to decompress the data while transferring to the synchronous memory device.

7. The processing system of claim 6 wherein the synchronous memory device initiates the data transfer.

8. The processing system of claim 7 wherein the synchronous memory device provides a system reset signal to the processor after the data is transferred from the flash memory device.

9. The processing system of claim 6 wherein the synchronous memory device is an SDRAM.

10. The processing system of claim 6 wherein the synchronous memory device is an RDRAM.

11. A processor system power-up method, in a system having a processor coupled to a synchronous memory over a synchronous first bus and a flash memory device over a serial second bus, the synchronous memory connected to the flash memory device over a dedicated third bus, the method comprising:
    detecting a power-up condition with a reset controller and providing a reset signal to the synchronous memory;
    using the synchronous memory, initiating a data transfer, over the dedicated third bus without intervention by another device, from the flash memory that is separate from the synchronous memory and that comprises a decompression capability to the synchronous memory in response to the reset signal;
    using the decompression capability of the flash memory, decompressing data stored in the flash memory while transferring the data to the synchronous memory over the dedicated third bus; and
    providing a system reset signal from the synchronous memory to the processor after the data has been transferred.

12. The method of claim 11 wherein the synchronous memory is coupled to the processor via a synchronous bus.

13. The method of claim 11 wherein the synchronous memory device is either an SDRAM or an RDRAM.

14. A method of loading a synchronous dynamic random access memory (SDRAM) in a system having a processor coupled to the SDRAM over a synchronous first bus and a flash memory device over a serial second bus, the method comprising:
    using the SDRAM, initiating a data transfer from a the flash memory, that is separate from the SDRAM, to the synchronous dynamic random access memory over a dedicated third bus that connects only the SDRAM and the flash memory without intervention by another device; and decompressing data stored in the flash memory while transferring the data to the synchronous dynamic random access memory; and providing a system reset signal from the SDRAM to the processor after the data has been transferred.

15. A method of loading a synchronous rambus dynamic random access memory (RDRAM) in a system having a processor coupled to the SDRAM over a synchronous first bus and a flash memory device over a serial second bus, the method comprising:

using the RDRAM, initiating a data transfer from the flash memory, comprising a decompression capability, to the synchronous rambus dynamic random access memory in response to the reset signal, the data transfer occurring over a dedicated third bus connected only between the flash memory and the synchronous rambus dynamic random access memory without intervention by another device;

using the decompression capability, decompressing data stored in the flash memory while transferring the data to the synchronous rambus dynamic random access memory; and providing a system reset signal from the RDRAM to the processor after the data has been transferred.

* * * * *

UNITED STATES PATENT AND TRADEMARK OFFICE
CERTIFICATE OF CORRECTION

PATENT NO. : 7,035,965 B2 Page 1 of 1
APPLICATION NO. : 09/943475
DATED : April 25, 2006
INVENTOR(S) : Cliff Zitlaw It is certified that error appears in the above-identified patent and that said Letters Patent is hereby corrected as shown below:

Column 4,
Line 62, delete "a" after "from"

Signed and Sealed this

Seventeenth Day of October, 2006

JON W. DUDAS
*Director of the United States Patent and Trademark Office*